(12) United States Patent
Chen et al.

(10) Patent No.: US 10,887,027 B2
(45) Date of Patent: Jan. 5, 2021

(54) DYNAMIC PASSIVE INTERMODULATION REFERENCE SIGNAL GENERATOR

(71) Applicant: XI'AN JIAOTONG UNIVERSITY, Shaanxi (CN)

(72) Inventors: Xiong Chen, Xian Shaanxi (CN); Yongning He, Xian Shaanxi (CN)

(73) Assignee: XI'AN JIAOTONG UNIVERSITY, Shaanxi (CN)

(*) Notice: Subject to any disclaimer, the term of this patent is extended or adjusted under 35 U.S.C. 154(b) by 278 days.

(21) Appl. No.: 15/981,940

(22) Filed: May 17, 2018

(65) Prior Publication Data

US 2018/0269994 A1 Sep. 20, 2018

Related U.S. Application Data

(63) Continuation of application No. PCT/CN2016/070261, filed on Jan. 6, 2016.

(30) Foreign Application Priority Data

Nov. 25, 2015 (CN) .......................... 2015 1 0830080

(51) Int. Cl.
*H04B 17/11* (2015.01)
*H04B 17/00* (2015.01)
(Continued)

(52) U.S. Cl.
CPC ......... *H04B 17/11* (2015.01); *H04B 17/0085* (2013.01); *H04B 17/103* (2015.01); *G01R 31/11* (2013.01)

(58) Field of Classification Search
None
See application file for complete search history.

(56) References Cited

U.S. PATENT DOCUMENTS

| 2010/0085061 A1* | 4/2010 | Bradley ................. G01R 31/11 324/520 |
| 2013/0188755 A1 | 7/2013 | Lu et al. |
| 2015/0349819 A1 | 12/2015 | Meng |

FOREIGN PATENT DOCUMENTS

| CN | 103199808 A | 7/2013 |
| CN | 103227653 A | 7/2013 |
| CN | 103269253 A | 8/2013 |

OTHER PUBLICATIONS

International Search Report dated Aug. 24, 2016 from corresponding PCT/CN2016/070261, pp. 4.

(Continued)

*Primary Examiner* — Jas A Sanghera
(74) *Attorney, Agent, or Firm* — Dragon Sun Law Firm, PC; Jinggao Li, Esq.

(57) ABSTRACT

A dynamic dual-port passive intermodulation reference signal generator for calibrating an intermodulation testing device includes: a power allocation coupling network, a non-linear device located under a biasing condition, and a voltage modulation module. Extraction of a carrier signal is performed through a power distribution coupling network; the carrier signal as extracted excites a non-linear device to generate an intermodulation signal; this part of signal, together with the excitation signal, is coupled back to two ports of the generator by the same power distribution coupling network, thereby forming reflected and transmitted reference intermodulation levels as reference sources for calibrating the intermodulation testing apparatus. The voltage modulation generating module generates a voltage wave of a certain value, implementing modulation of the intermodulation signal; through the modulated intermodulation signal, the intermodulation testing region power level and intermodulation transient response feature within a nominal range are calibrated for the intermodulation testing device.

8 Claims, 3 Drawing Sheets

(51) Int. Cl.
*H04B 17/10* (2015.01)
*G01R 31/11* (2006.01)

(56) References Cited

OTHER PUBLICATIONS

International Written Opinion dated Aug. 24, 2016 from corresponding PCT/CN2016/070261, pp. 3.

* cited by examiner

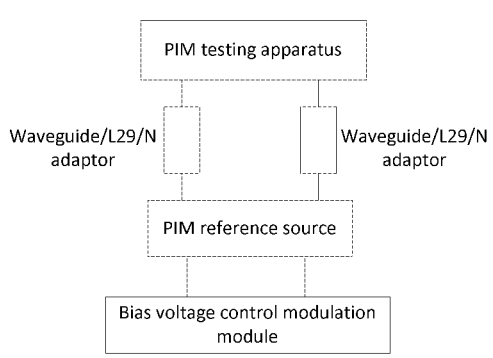
Fig. 6-a
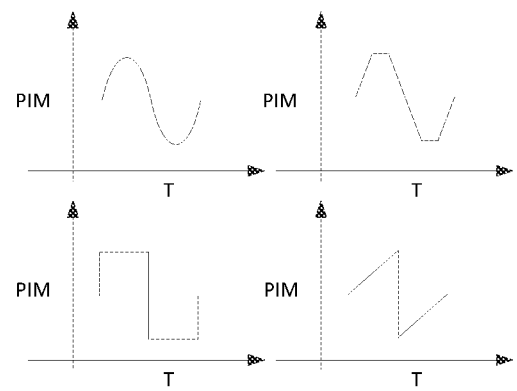
Fig. 6-b
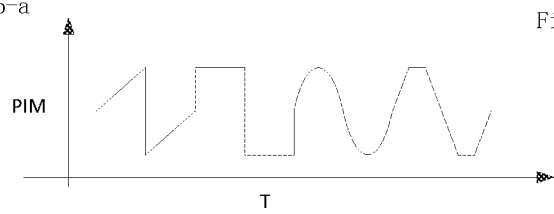
Fig. 6-c

DYNAMIC PASSIVE INTERMODULATION REFERENCE SIGNAL GENERATOR

CROSS-REFERENCE TO RELATED APPLICATION

This application is a continuation application of International Patent Application No. PTC/CN2016/070261, filed Jan. 6, 2016, which itself claims the priority to Chinese Patent Application No. 201510830080.8, filed Nov. 25, 2015 in the State Intellectual Property Office of P.R. China, both of which are expressly incorporated by reference herein in their entirety.

FIELD

The present disclosure relates to the technical field of calibrating a passive intermodulation (PIM) testing system, and more specifically, relates to a dynamic dual-port passive intermodulation reference signal generator that may provide a specific continuous modulable passive intermodulation reference signal for calibrating a passive intermodulation testing device.

BACKGROUND

When two or more carrier signals pass through a passive component having a nonlinear response, a new signal different from dual carrier frequencies will be generated. This phenomenon is referred to as passive intermodulation. Passive intermodulation PIM refers to a spurious signal generated by mixing transmit carriers of two or more frequencies in a passive non-linear device.

At present, a general passive intermodulation apparatus tests an intermodulation feature of a to-be-tested passive device based on carrier combination according to a carrier and intermodulation signal split principle; excites the to-be-tested device using amplified dual carrier or multiple carrier; obtains passive intermodulation co-produced under multiple carrier excitation condition via duplexers and filters, thereby obtaining a passive intermodulation power value, and evaluates an intermodulation index of the to-be-tested passive device. At present, calibration of the passive intermodulation testing apparatus generally employs a single port passive intermodulation signal calibration source having a fixed intermodulation value to evaluate the testing apparatus, and an accuracy of the testing apparatus is appraised by comparing the passive intermodulation signal calibration source and an actual measurement result. The currently common intermodulation procedure has the following drawbacks:

1. a common single-port passive intermodulation signal calibration source can only evaluate a reflected intermodulation value of a passive intermodulation testing apparatus. However, in actuality, the reflected intermodulation performance only characterizes one aspect of the passive intermodulation testing apparatus, such that a single reflected intermodulation index without a transmitted intermodulation index cannot comprehensively evaluate the performance of the passive intermodulation testing apparatus;

2. in current testing, a strong passive intermodulation signal is easy to be tested accurately, and a weak passive intermodulation signal is difficult to be tested in passive intermodulation testing. Because an intermodulation power value provided by the single-port passive intermodulation calibration source is one-fold, which can only generate an intermodulation signal of one power level, the reference passive intermodulation value as provided can only calibrate a certain intermodulation power point of the testing apparatus; without an intermodulation test power value point calibrated by an intermodulation reference level, a testing result provided by the passive intermodulation testing apparatus is less convincing. However, at present, a solution in this aspect can only be achieved by changing different calibration sources. Its process is not only cumbersome, and also introduces an issue of connection uncertainty between multiple calibration sources and the intermodulation testing apparatuses; and 3. for a time-varying transient-state response feature of the intermodulation testing apparatus, e.g., continuous abnormal fluctuation phenomenon arising during the testing apparatus, there is no solution for its evaluation and testing yet.

In general, the present disclosure provides a complete dynamic dual-port passive intermodulation calibration source structure to address the problems above, which may provide transmitted and reflected intermodulation reference signals, and meanwhile regulate the generated reference level in a large dynamic range, thereby satisfying calibration of testing points within a large range of the intermodulation testing apparatus; finally, the generated intermodulation reference level may implement detection and evaluation of transient response features of the intermodulation testing apparatus with respect to time modulation, thereby solving the problems above existing in the current intermodulation testing apparatus.

SUMMARY

In order to overcome the drawbacks of a general single-port fixed intermodulation calibration device, the present disclosure provides a new structure and a solution that can not only provide dual-port intermodulation level values, as reflected and transmitted intermodulation reference sources of the intermodulation testing system, for calibrating the intermodulation testing apparatus, but also can introduce a dynamic intermodulation level control technology, which may perform transient modulation to the intermodulation reference level, thereby achieving that one intermodulation reference source may provide multiple intermodulation reference levels, and a transient response feature of the intermodulation testing apparatus may be modulated by observing a change pattern of the intermodulation testing device under a plurality of intermodulation values.

The technical solution of the present disclosure is provided below:

a passive intermodulation reference signal generator includes: two low intermodulation connectors (8, 9), a multi-stage power allocation coupling network, a non-linear device (7) that may be located under a biasing condition, two non-linear device match biasing networks (5, 6); wherein the non-linear device match biasing networks (5, 6) are connected to the non-linear device (7) to cause the non-linear device (7) in a biasing state; a carrier signal is extracted through the multi-stage power allocation coupling network; the carrier signal as extracted excites the non-linear device to generate a passive intermodulation signal; the passive intermodulation signal, together with an excitation signal, are coupled back to a port of the generator connected to the to-be-calibrated intermodulation testing system by the same power allocation coupling network, and are transmitted to low intermodulation connectors (8, 9), thereby forming reflected and transmitted reference intermodulation levels, respectively.

Further, the generator is also provided with a voltage modulation module (10) to regulate a bias voltage of the non-linear device (7) through the non-linear device match biasing network (5, 6); the bias voltage introduced by the voltage modulation module 10 may be regulated within a certain extent from positive to negative, thereby generating multiple intermodulation level values through one signal generator, and calibrating, for the intermodulation testing device, different power values of intermodulation testing regions within a nominal range.

Furthermore, the generator is a dynamic passive intermodulation reference signal generator, where the voltage modulation module (10) may introduce a bias voltage to perform a continuous regulation from positive to negative, thereby achieving a change trend of the intermodulation signal varying with the bias voltage; in this way, through a modulated intermodulation signal waveform, calibration of the intermodulation transient response feature may be performed while different power levels of the intermodulation testing regions are calibrated within the nominal range for the intermodulation testing apparatus.

Advantageous effects of the present disclosure lie in:

(1) providing dual-port reference reflected and transmitted intermodulation levels with equal power values, evaluating the reflected intermodulation value and the transmitted intermodulation value of the passive intermodulation testing apparatus, obtaining a reflected intermodulation index and a transmitted intermodulation index, thereby performing a more comprehensive evaluation and calibration for the passive intermodulation testing apparatus;

(2) transient modulation may be performed to the intermodulation level to achieve a function that a calibration source can generate a plurality of reference intermodulation levels, thereby calibrating a plurality of intermodulation testing power value points; and (3) a switch response time between multiple intermodulation levels may be controlled, so as to check the transient response features of the intermodulation testing apparatus with respect to the to-be-tested intermodulation signal.

BRIEF DESCRIPTION OF THE DRAWINGS

FIG. 6-a shows a schematic diagram of implementing transient regulation of the intermodulation reference signal by adding an offset voltage control modulation module;

FIG. 6-b shows an effective diagram of an intermodulation waveform implemented after controlling the offset voltage control modulation module;

FIG. 6-c shows an effect of continuous stepped conversion of multiple intermodulation waveforms implemented by setting an offset voltage control modulation module.

DETAILED DESCRIPTION

In order to make the objective, technical solution, and advantages of the present disclosure much clear and apparent, further detailed explanation will be made to the present disclosure with reference to the accompanying drawings and embodiments. It should be understood that the embodiments described here are for explaining the present disclosure, not intended to limit the present disclosure.

Regarding the main drawbacks of a single-port passive intermodulation reference signal generator with a fixed intermodulation value in the prior art, the present disclosure provides a new structure that may provide dual-port intermodulation power level values, i.e., the reflected and transmitted intermodulation reference sources for the intermodulation testing system, for calibrating the intermodulation testing apparatus; further, it also relates to a dynamic intermodulation power level control technology, which may perform transient modulation of the intermodulation reference level, such that one intermodulation reference source may provide a plurality of intermodulation reference levels, and the transient response feature of the intermodulation testing apparatus may be detected.

Hereinafter, a dual-port passive intermodulation reference signal generator in one embodiment will be illustrated with reference to FIG. 1, mainly including: low intermodulation connectors 8, 9, a multi-stage power allocation coupling network, a non-linear device 7 that may be located under a biasing condition, non-linear device match biasing networks 5, 6; wherein the non-linear device match biasing networks 5, 6 are connected to the non-linear device 7 to cause the non-linear device 7 in a biasing state; the power allocation coupling network performs extraction of a carrier signal; the carrier signal as extracted then excites the non-linear device to generate a passive intermodulation signal; the passive intermodulation signal, together with an excitation signal, are coupled back to two ports of the generator connected to the to-be-calibrated intermodulation testing system by the same power allocation coupling network, and are transmitted to low intermodulation connectors 8, 9, thereby forming reflected and transmitted reference intermodulation levels, respectively. In this way, a dual-port signal generator is implemented, and meanwhile, the reflected intermodulation and transmitted intermodulation indexes of the intermodulation testing system may be evaluated simultaneously.

Figure 1:
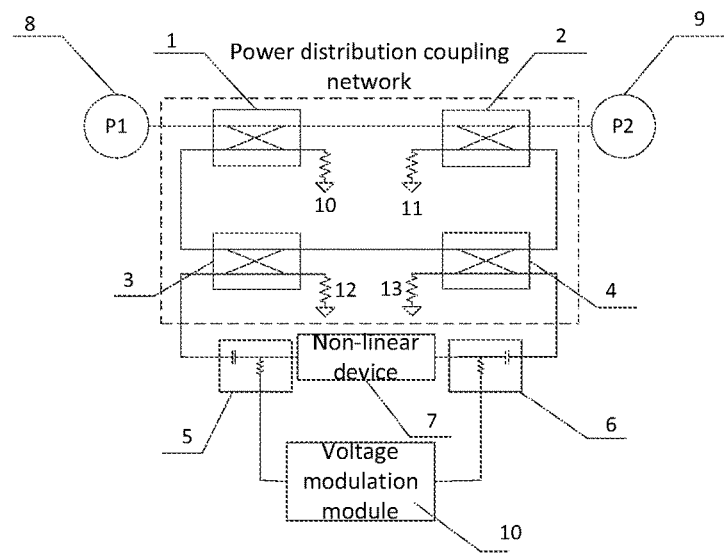
FIG. 1 shows a block diagram of a principle of a dynamic passive intermodulation reference signal generator in one embodiment of the present disclosure.

Further, as shown in FIG. 1, the generator is a dynamic dual-port passive intermodulation reference signal generator, which is also provided with a voltage modulation module 10. Through the non-linear device match biasing networks 5, 6, the bias voltage of the non-linear device may be regulated, such that the bias voltage introduced by the voltage modulation module 10 may be regulated in a certain range from positive to negative, such that one signal generator may generate a plurality of intermodulation level values, so as to calibrate different power values in intermodulation testing regions within a nominal range with respect to the intermodulation testing device.

Further, the dynamic dual-port passive intermodulation reference signal generator relates to a dynamic intermodulation level control technology. The voltage modulation module 10 may introduce continuous regulation of the bias voltage from positive to negative, thereby implementing a change trend of the intermodulation signal varying with the bias voltage; therefore, through a modulated intermodulation signal waveform, the intermodulation transient response feature may be calibrated while different power levels of the intermodulation testing regions are calibrated within the nominal range for the intermodulation testing apparatus.

Specifically, the multi-stage power allocation coupling network includes four directional couplers 1-4 and four load match resistances 10-13, thereby forming a two-stage coupling system, so as to prevent counteraction of carrier signals coupled along two reverse directions of a carrier path through a first-stage coupling system formed by a directional coupler having a high isolation degree; meanwhile, main arms of two directional couplers 3, 4 forming a carrier excitation path; after the excitation signal completes excitation of the non-linear device, it is re-coupled back to the carrier transmission path together with the generated intermodulation signal by a same coupling network, such that an insert loss of the whole reference source generator is reduced to the minimum; power distribution is implemented through the first-stage coupling system and the second-stage coupling system so as to implement a specific intermodulation reference power level value.

Specifically, the above non-linear device may employ a Schottky or a variable capacitance diode. Meanwhile, in order to obtain an intermodulation reference signal without interference noise, the intermodulation testing device may be calculated more accurately; the entire signal generator circuit is adapted to be manufactured on a high frequency low PIM medium board; with the same microwave transmission line theory, the above structure may also be implemented through a cavity structure to achieve the same function.

In one embodiment, the dynamic dual-port passive intermodulation reference signal generator can simultaneously provide intermodulation reference signals in two directions because it has two ports, such that when the signal generator calibrates the transmitted and reflected modes simultaneously, the to-be-calibrated intermodulation testing apparatus should be in a state where both of the transmitted and reflected intermodulation testing modes are opened. However, when only an arbitrary testing mode is opened, the function of the reference source signal generator is not affected, which may act as an independent transmitted or reflected intermodulation calibration source.

In another embodiment, one of the ports of the signal generator is terminated to a low PIM load, used as a single-port intermodulation reference signal generator, which can be used for calibrating a single reflected intermodulation like a common single-port intermodulation reference signal generator.

Figure 2:
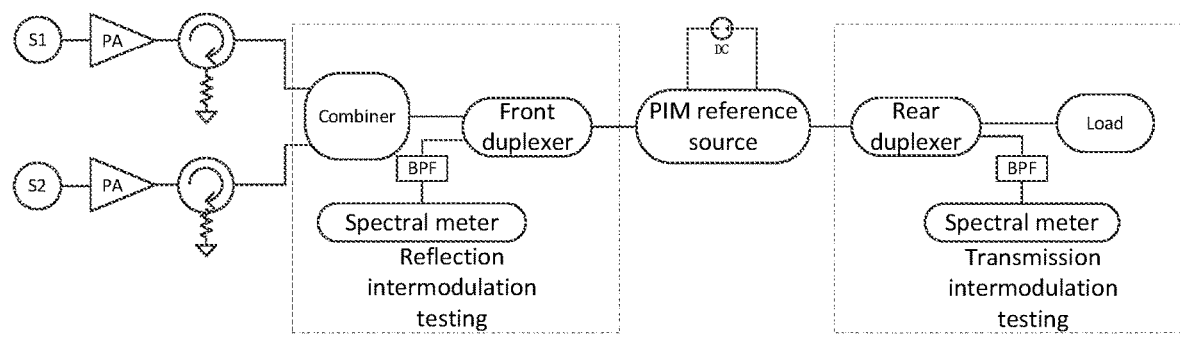
FIG. 2 shows a block diagram of a principle of calibrating an intermodulation testing system using a dynamic passive intermodulation reference signal generator in the present disclosure.

FIG. 2 will be referenced to illustrate specific application of the dynamic dual-port passive intermodulation reference signal generator to an actual calibration of the intermodulation testing system. FIG. 2 illustrates the calibration structure and the flow of the entire intermodulation testing system. Carrier signals emitted from two carrier signal sources S1, S2 pass through a power amplifier and a circulator, and are then input into a PIM reference source (here, the dynamic dual-port passive intermodulation reference signal generator in the present disclosure is adopted) through a combiner and a pre-stage duplexer, and finally is absorbed by a load of the testing system. When the carrier formed by combination enters into the dynamic passive intermodulation reference signal generator, a transmitted intermodulation reference signal and a reflected intermodulation reference signal may be obtained at two ports of the dynamic dual-port passive intermodulation reference signal generator, respectively, wherein the reflected intermodulation reference signal propagated reverse to the carrier path is received and measured by a receiver via an intermodulation channel of the pre-stage duplexer, while the transmitted intermodulation signal propagated along the carrier path is received and measured by the receiver via an intermodulation channel of a post-stage duplexer, thereby simultaneously implementing calibration of the reflected intermodulation and transmitted intermodulation testing.

Further, with the dynamic intermodulation level control technology, the bias voltage of the non-linear device in the dynamic dual-port passive intermodulation reference signal generator is regulated, which bias voltage may be regulated from positive to negative, thereby achieving a change trend of the intermodulation signal varying with the bias voltage; therefore, through a modulated intermodulation signal waveform, the intermodulation transient response feature may be calibrated while different power levels of the intermodulation testing regions are calibrated within the nominal range for the intermodulation testing apparatus.

Figure 3:
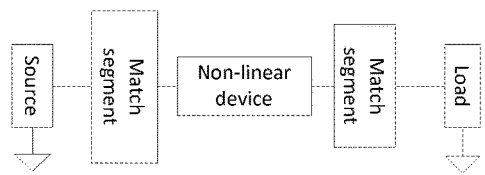
FIG. 3 shows a block diagram of an interchangeable match network for a diode.

In a specific embodiment, the dynamic dual-port passive intermodulation reference signal generator introduces an interchangeable diode match network, as shown in FIG. 3. The interchangeable match network of the diode is implemented based on a symmetrical structure, including a source, a match segment, a diode, a match segment, and symmetrical load sources in succession from the left; a pair of biasing networks is combined into two interchangeable match segments. Based on this interchangeable structure, the intermodulation reference signal produced on the non-linear device (diode) can be transmitted to two ports with equal amplitude and equal phase, thereby providing the reflected intermodulation reference signal and the transmitted intermodulation reference signal with equal amplitude and equal phase, respectively. In this structure, the biasing network is combined in the interchangeable match segment. By using a pair of biasing network, different non-linear devices are implemented. Their bias voltages may be regulated from positive to negative, implementing a change trend of the intermodulation signal varying with bias voltages.

Figure 4:
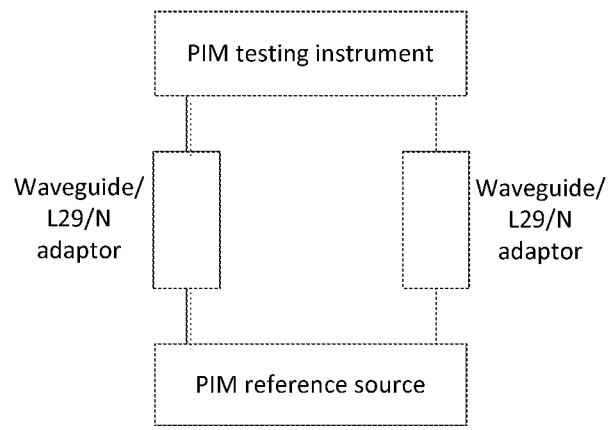
FIG. 4 shows a schematic diagram of connections to a corresponding intermodulation testing system through different adaptors.

Further, as shown in FIG. 4, in a case of calibrating different passive intermodulation testing systems, a difference between different passive intermodulation testing systems should be considered; the existing passive intermodulation testing systems have a plurality of different structures. Besides the coaxial intermodulation testing system, there further include intermodulation testing systems such as a micro-strip and a cavity. In actual calibration of an application, for different testing system structures, different improvements are performed to the embodiments. With corresponding different low PIM adaptors, the adaptors for coupling from the micro-strip to coaxial, from micro-strip to wave guide, and from micro-strip to micro-strip are implemented, and calibration of the intermodulation testing system such as co-axis, cavity, and micro-strip is implemented; their implementation processes are not only limited to the micro-strip transmission line, and they may also be implemented through other microwave transmission line structures such as coaxial or waveguide transmission structures; with a corresponding low PIM adaptor, it is not only applicable to a coaxial intermodulation testing system, but also applicable to an intermodulation testing system such as micro-strip, coaxial or cavity.

Figure 5:
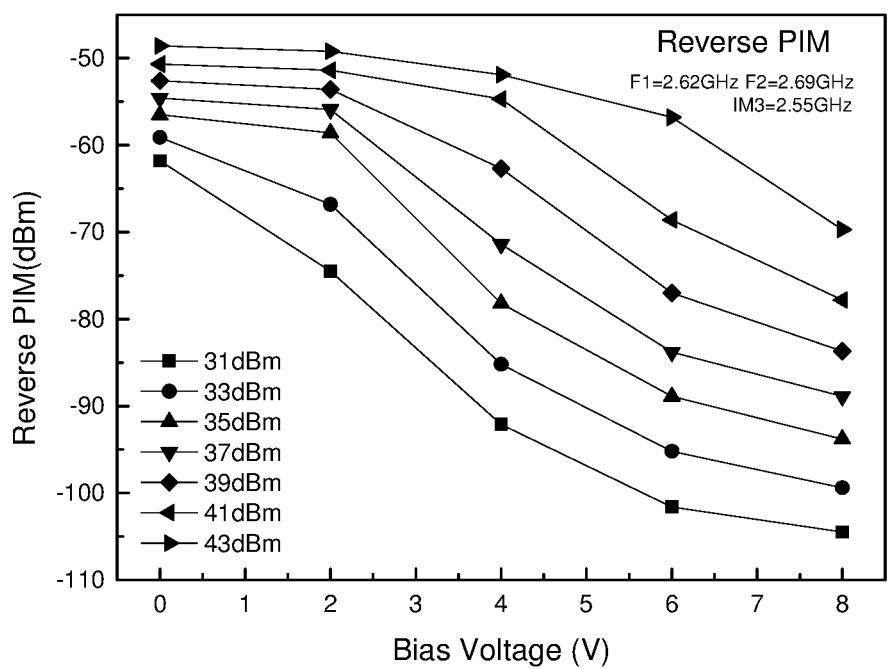
FIG. 5 shows an effect diagram of achieving transient regulation of an intermodulation reference signal by adding bias voltages.

Further, in one embodiment, as shown in the actually measured curve in FIG. 5, by regulating the voltage values at the two ends of the diode, the intermodulation power level changes apparently. As shown in FIG. 6, as an improved optimization, a bias voltage control modulation module is added, or the bias voltage control modulation module is used to replace the voltage modulation module, so as to implement fast continuous regulation of the intermodulation reference signal, thereby outputting continuous voltage waveform through modulation. Controlling the output waveform of the bias voltage control modulation module may correspondingly obtain an intermodulation signal waveform on the intermodulation signal generator. The bias voltage control modulation module is accessed to the reference signal generator via DC input ports of a pair of biasing devices, such that the intermodulation signal level is associated with the output voltage of the bias voltage control regulation module, thereby implementing the continuous and transient regulation function of the reference intermodulation level and realizing intermodulation response evaluation in a large range region for the intermodulation testing device.

The description and application of the present disclosure here are illustrative, not intended to limit the scope of the present disclosure in the above embodiment. The transformations and changes to the embodiments disclosed here are possible; for any person of normal skill in the art, various substituted and equivalent components in the embodiments are well known. For a person of normal skill in the art, without departing from the sprit or essential feature of the present disclosure, the present disclosure may be implemented with other forms, structures, arrangements, proportions, and other components, materials, and parts. Without departing from the scope and spirit of the present disclosure, the embodiments disclosed here may be subject to other variations and changes.

What is claimed is:

1. A dual-port passive intermodulation reference signal generator comprising: two intermodulation connectors (8, 9), a multi-stage power allocation coupling network, a non-linear device (7) that is located in a biasing condition, and two non-linear device match biasing networks (5, 6); wherein the non-linear device match biasing networks (5, 6) are connected to the non-linear device (7) to cause the non-linear device (7) in a biasing state; a carrier signal is extracted through the multi-stage power allocation coupling network; the carrier signal as extracted excites the non-linear device to generate a passive intermodulation signal; the passive intermodulation signal, together with an excitation signal, are coupled back to a port of the generator connected to a to-be-calibrated intermodulation testing system by the same power allocation coupling network, and transmitted to the two intermodulation connectors (8, 9), thereby forming reflected and transmitted reference intermodulation levels, respectively.

2. The reference signal generator according to claim 1, wherein the reference signal generator is further provided with a voltage modulation module (10) to regulate a bias voltage of the non-linear device (7) through the non-linear device match biasing networks (5, 6); the bias voltage introduced by the voltage modulation module (10) is regulated within a certain extent from positive to negative, thereby generating multiple intermodulation level values through one signal generator; and for an intermodulation testing device, different power values of intermodulation testing regions are calibrated within a nominal range.

3. The reference signal generator according to claim 1, wherein the generator is a dynamic passive intermodulation reference signal generator, where a voltage modulation module (10) introduces a bias voltage to perform a continuous regulation from positive to negative, achieving a change trend of the intermodulation signal varying with the bias voltage; therefore, through a modulated intermodulation signal waveform, an intermodulation transient response feature is calibrated while different power levels of an intermodulation testing regions are calibrated within a nominal range for a intermodulation testing apparatus.

4. The reference signal generator according to claim 1, wherein the multi-stage power allocation coupling network comprises four directional couplers (1-4) and four load match resistances (10-13), thereby forming a two-stage coupling system; main arms of two directional couplers (3, 4) form a carrier excitation path; secondary arms are connected with a second-stage couplers to form an intermodulation power excitation network; power distribution is implemented through a first-stage coupling system and a second-stage coupling system, thereby achieving a specific intermodulation reference level value.

5. The reference signal generator according to claim 1, wherein the reference signal generator simultaneously provides intermodulation reference signals in two directions, such that the reference signal generator simultaneously calibrates a transmitted and reflected modes; a to-be-calibrated intermodulation testing apparatus is in a state where both of a transmitted and reflected intermodulation testing modes are opened; while when only an arbitrary testing mode is opened, the function of the reference source signal generator is not affected, which acts as an independent transmitted or reflected intermodulation calibration source.

6. The reference signal generator according to claim 1, wherein the reference signal generator is formed based on a left-to-right interchangeability principle, such that when one port is terminated to a PIM load, it is used for a general reflected intermodulation calibration source, whose reference level regulation function is not affected.

7. The reference signal generator according to claim 1, wherein the non-linear device employs a Schottky or a variable capacitance diode.

8. The reference signal generator according to claim 1, wherein a bias voltage control modulation module is added; a continuous voltage waveform is outputted through modulation; the bias voltage control modulation module is accessed to the reference signal generator via DC input ports of a pair of biasing devices, such that the intermodulation signal level is associated with an output voltage of the bias voltage control modulation module.

* * * * *